United States Patent [19]

Heirich

[11] Patent Number: 5,730,512
[45] Date of Patent: Mar. 24, 1998

[54] MULTIPIECE MONITOR HOUSING HAVING VENTED JOINTS

[75] Inventor: Douglas L. Heirich, Redwood City, Calif.

[73] Assignee: Apple Computer, Inc., Cupertino, Calif.

[21] Appl. No.: 418,673

[22] Filed: Apr. 7, 1995

[51] Int. Cl.$^6$ .................................................. H05K 7/20
[52] U.S. Cl. ................................................ 312/7.2; 361/692
[58] Field of Search .................................. 220/4.02, 306, 220/307; 312/7.2; 348.1; 361/678, 692; 348/836, 843; 454/184

[56] References Cited

U.S. PATENT DOCUMENTS

| | | | |
|---|---|---|---|
| 3,251,939 | 5/1966 | Pestka et al. | 348/843 X |
| 4,411,480 | 10/1983 | Gibson | 312/7.2 |
| 4,635,809 | 1/1987 | Bachman et al. | 312/7.2 X |
| 4,840,286 | 6/1989 | Heberling et al. | 361/692 X |
| 5,363,150 | 11/1994 | Kojima | 312/7.2 X |

FOREIGN PATENT DOCUMENTS 2 554 299   5/1985   France ..................................... 312/7.2

*Primary Examiner*—Harold Joyce
*Attorney, Agent, or Firm*—Carr & Ferrell

[57] ABSTRACT

A multipiece housing for a monitor having a first section with a plurality of projections, and a second section having a plurality of receptacles for receiving the plurality of projections during the assembly of the housing. Each receptacle includes an air duct enabling air to flow bidirectionally between outside the housing and inside the housing after being assembled. Separate sections of the multipiece housing are completely assembled by hand and without using any special tools. Each receptacle includes a pair of parallel guide rails and a slanted surface which guide each receptacle into a slot in the corresponding projection. Joints formed between the separate sections, while enabling air to pass, prohibit accidental access to the internal components of the monitor. Snap features are included on one of the sections to assist in securing together the first and second sections during assembly.

22 Claims, 11 Drawing Sheets

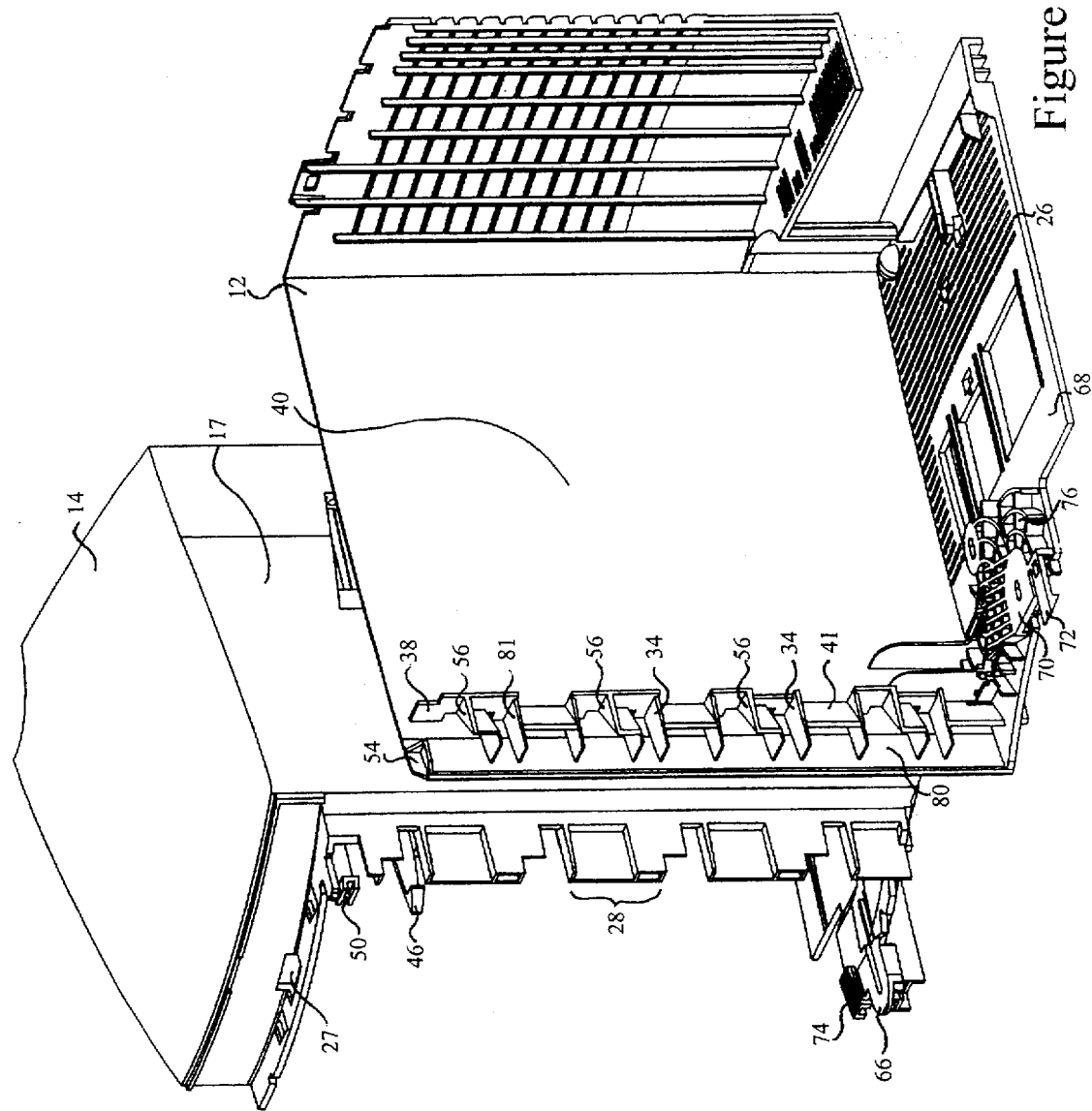

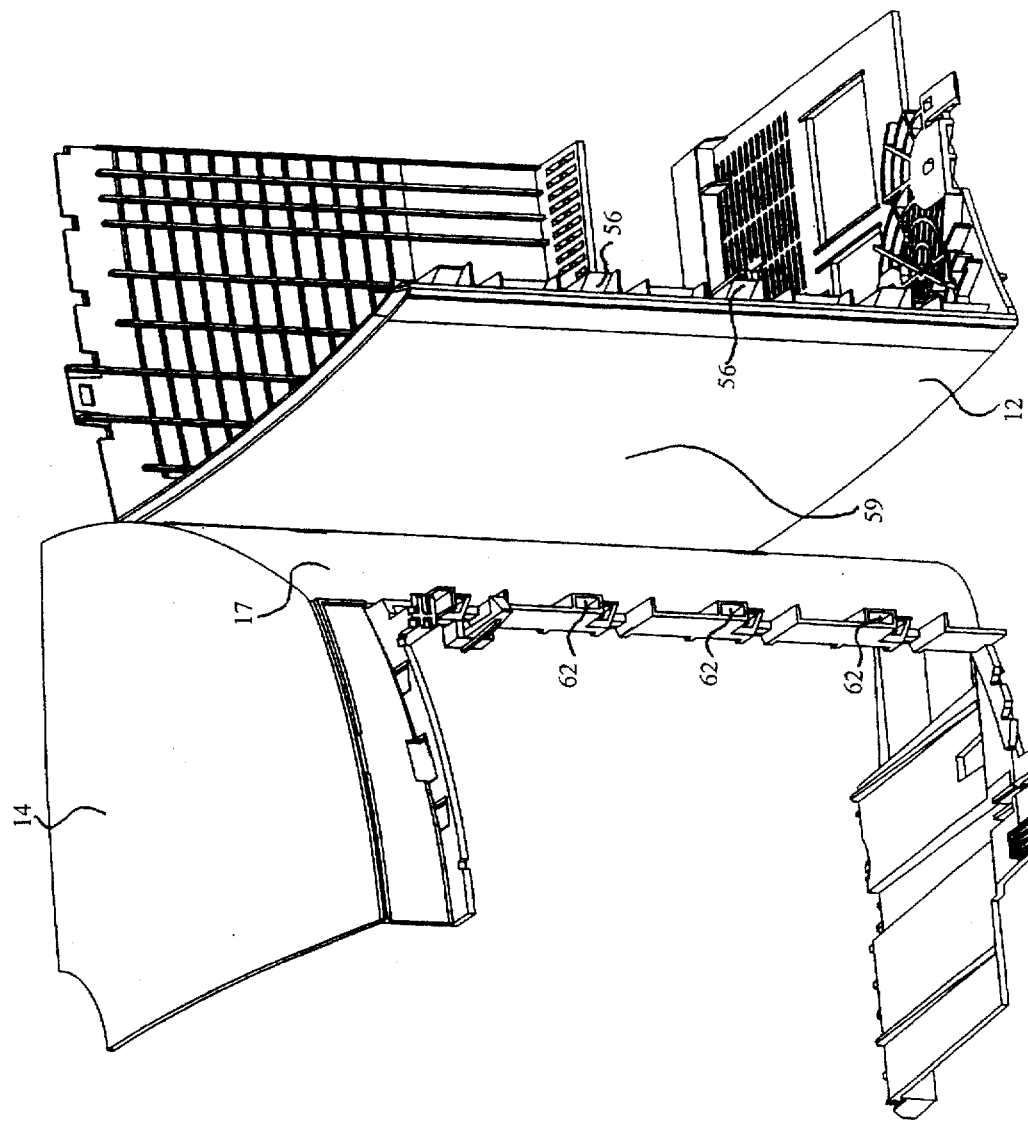

5,730,512

MULTIPIECE MONITOR HOUSING HAVING VENTED JOINTS

This application hereby incorporates by reference the following two co-pending applications which have the same Assignee: (1) U.S. patent application entitled "Modular Monitor Architecture," having Ser. No. 08/413,401, and filed on Mar. 30, 1995; and (2) U.S. patent application entitled "Monitor Housing Having A Replaceable Thermal Vent," having Ser. No. 08/456,628, and filed on Jun. 1, 1995.

BACKGROUND OF THE INVENTION

1. Field of the Invention

The present invention relates generally to housings for cathode ray tube (CRT) monitors. More particularly, the present invention relates to a vented joint for securing together two sections of a multipiece housing for a monitor.

2. Description of Related Art

The housings or outer shells of CRT monitors are manufactured in a myriad of different shapes and sizes. Due to the potential large size of these housings, it is more cost effective to design the housings in at least two sections, thereby utilizing a smaller capacity molding press. The larger the molded part, the more expensive the molding press is to operate. Molding and assembling multiple parts offers a potential cost savings over molding a larger housing. While multi-sectional monitor housings can be molded more cost effectively than single-piece housings, there still exist the added problems and costs of assembling the separate sections of the monitor housings. Furthermore, the joints formed by joining together the separate sections must withstand the forces and stresses that typically are applied to a fully assembled CRT monitor housing.

The monitor housing must also provide inlet and outlet air vents to allow cooling air to flow to and from the heat generating components inside the monitor housing. These vents are frequently a major constraint in developing Industrial Design styling treatments for monitors. These vents must also be designed to satisfy the regulations of Safety Agencies having jurisdiction over the production and sale of monitors. Conventional monitor housings provide heat vents on the surfaces of the separate sections of the housing, and not between the joints themselves.

Accordingly, there is a need for a monitor housing that has separate sections which may be quickly assembled into a strong assembly in a cost effective manner without the use of additional components, bonding steps, or assembly tools. There is also a need for a monitor housing that includes concealed vents that allow more freedom in Industrial Design styling.

SUMMARY OF THE INVENTION

The present invention overcomes the deficiencies in the prior art by providing a multipiece housing for a monitor having a first section with a plurality of projections, and a second section having a plurality of receptacles for receiving the plurality of projections during the assembly of the housing. Each receptacle includes an air duct enabling air to flow bidirectionally between inside the housing and outside the housing after being assembled. Separate sections of the multipiece housing are completely assembled by hand and without using any special tools. Each receptacle includes a pair of parallel guide rails and a slanted surface which guide each receptacle into a slot in the corresponding projection. Box joints formed by assembling the monitor housing provide greater strength and rigidity to the assembly than a single-piece molded housing would provide. Joints formed between the separate sections, while providing air vents, prohibit casual or accidental access to the internal components of the monitor. The air ducts also are concealed from a user's view. Snap features are included on one of the sections to secure together the first and second sections during and after assembly of the monitor housing.

BRIEF DESCRIPTION OF THE DRAWINGS

FIG. 2b is another cut-away perspective view of the two sections shown in FIG. 2a, but viewed from a slightly different angle;

FIG. 2c is another cut-away perspective view of the two sections shown in FIG. 2b, but viewed from a slightly different angle;

DESCRIPTION OF THE PREFERRED EMBODIMENT

Figure 1:
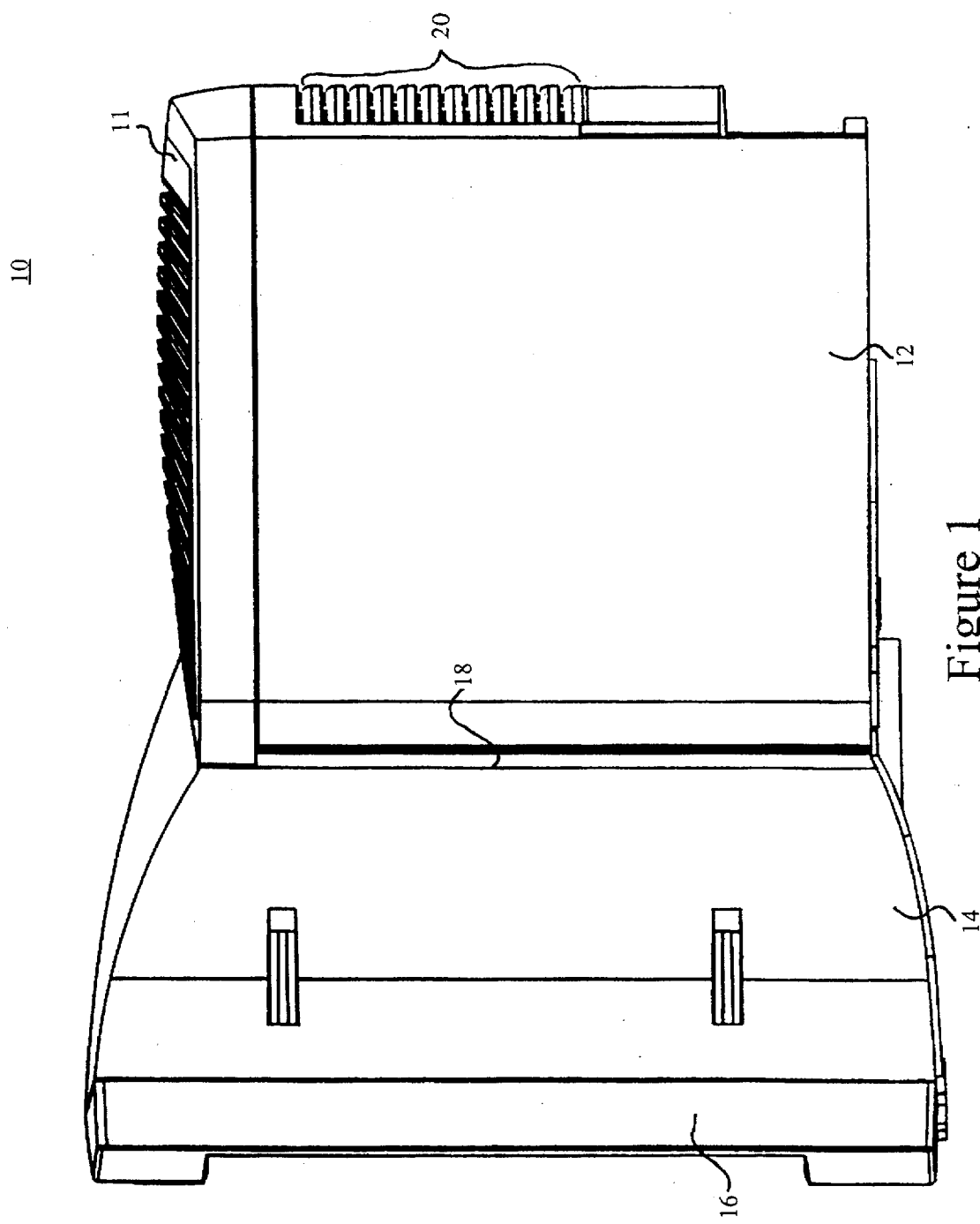
FIG. 1 is a right side perspective view of a multipiece monitor housing fully assembled and configured in accordance with the present invention.

Referring first to FIG. 1, illustrated is a right side perspective view of a fully assembled monitor housing 10 configured in accordance with the present invention. The housing 10 is composed of four major components, the aft bucket 12, the mid bucket 14, the lid 11, and the front cover or bezel 16. The aft bucket 12 and the mid bucket 14 are joined at a joint 18. Also illustrated are vents 20 at the back of the aft bucket 12.

Figure 1A:
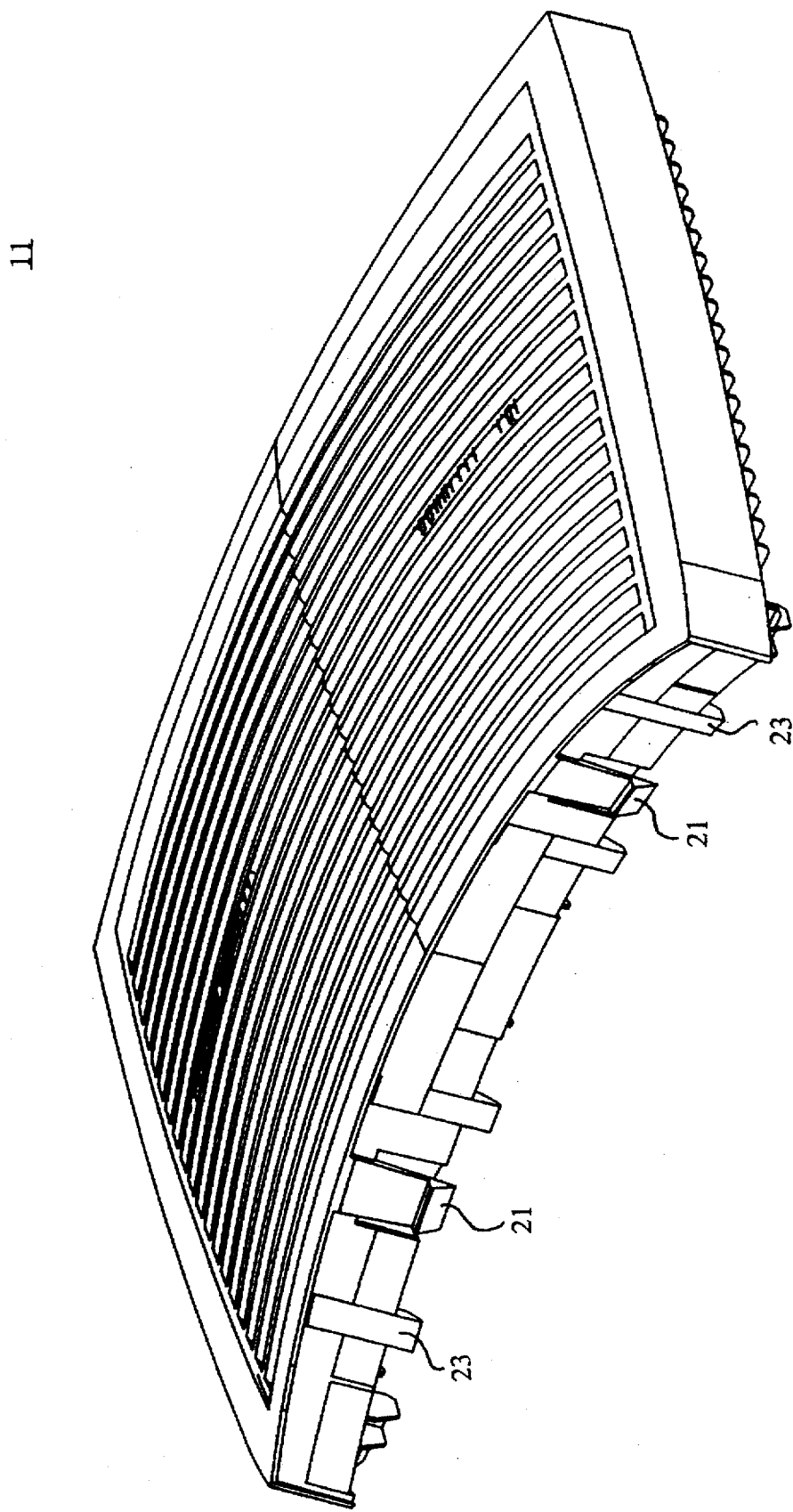
FIG. 1a is a perspective view of the lid of the monitor housing illustrated in FIG. 1.

Referring to FIG. 1a, illustrated is a perspective view of the lid 11 shown in FIG. 1. The lid 11 includes snap features 21 and posts 23, whose function will be described in more detail with reference to FIG. 2a.

Figure 2A:
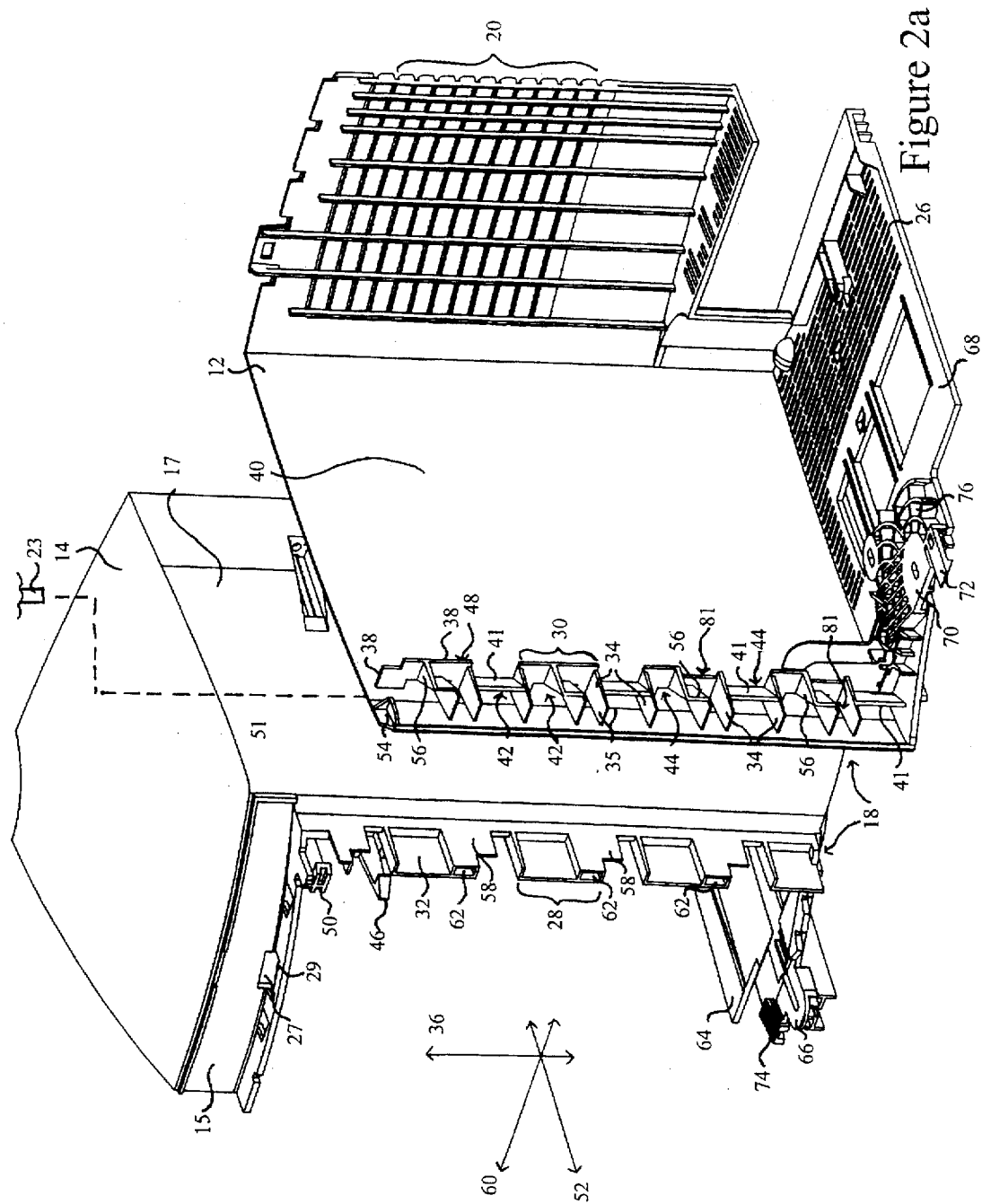
FIG. 2a is a cut-away view of two unassembled sections of the monitor housing shown in FIG. 1 and configured in accordance with the present invention.

Referring to FIG. 2a, illustrated are the mid bucket 14 and the aft bucket 12 in a disassembled arrangement. The left inner side 40 of the aft bucket 12 is shown, and the back 15 and outer left side 17 of the mid bucket 14 is shown. The joint 18 is also illustrated. The aft bucket 12 includes bottom air vents 26 and rear air vents 20.

Each snap feature 21 (FIG. 1a) is sized to clasp onto an edge 29 of an aperture 27 of the mid bucket 14 in a conventional manner. Each post 23 is sized to be fitted between a rib 54 and the bracket wall 38. The posts 23, in conjunction with the rib 54 and the bracket wall 38, provide a locking feature that secures an upper section of the joint 18 against disassembly.

In accordance with the present invention, aft bucket 12 and mid bucket 14 include interlocking elements at the joint 18 formed between the mid and aft bucket 14,12 during assembly, and these interlocking elements securely bind the mid and aft buckets 14,12 after assembly. Furthermore, the joint 18 forms an air vent enabling cooling air to enter through the joint 18, while still preventing casual or accidental access to the internal components of the monitor housing 10.

Figure 4A:
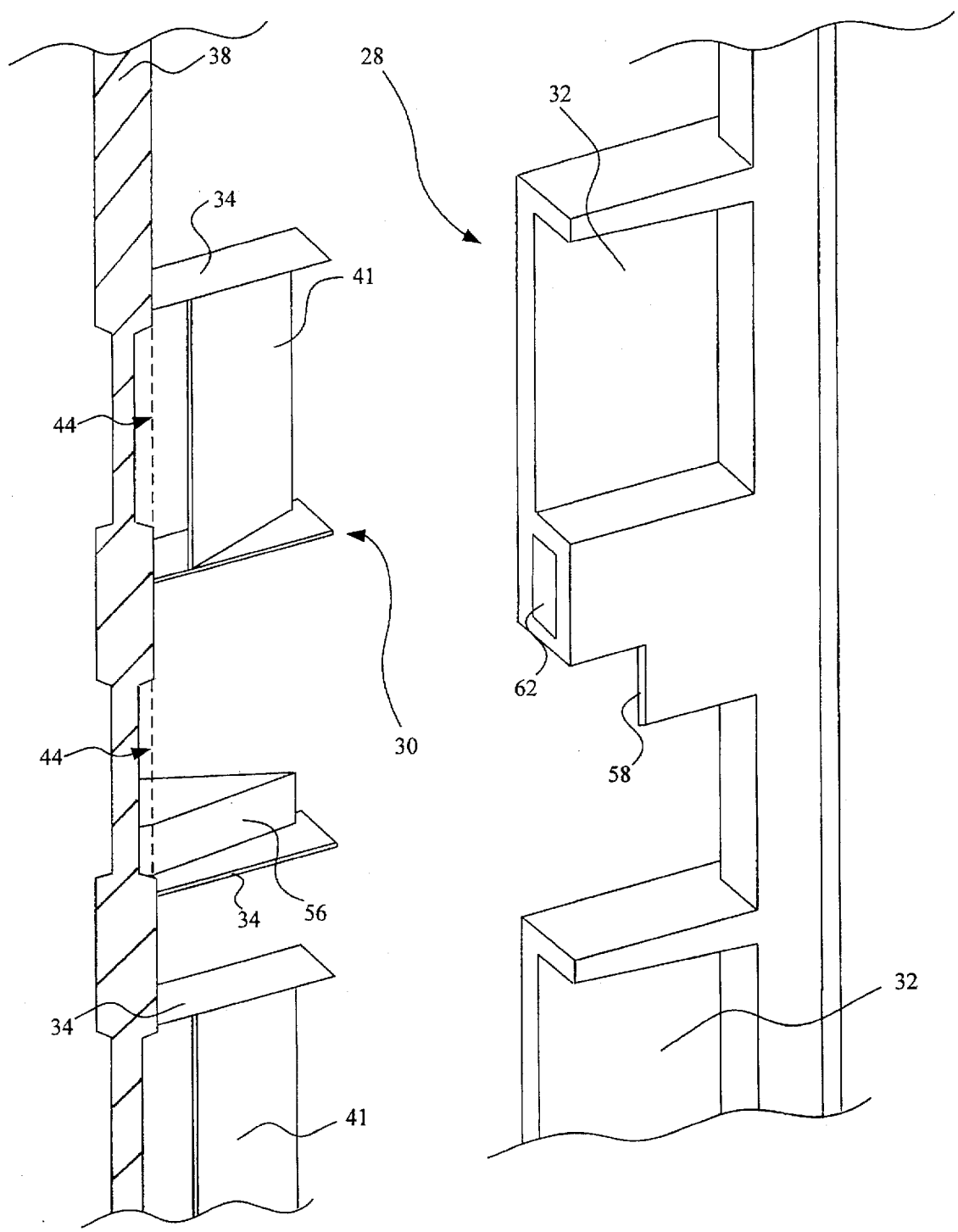
FIG. 4a is an enlarged perspective view of an unassembled joint configured in accordance with the present invention.

The mid bucket 14 includes a plurality of projections 28, and the aft bucket 12 has a plurality of receptacles 30 for receiving the projections 28. Each projection 28 includes a slot 32. Each receptacle 30 of the aft bucket 12 includes guide rails 34 which are sized to slide into the slot 32 and prevent opposing movement vertically 36 (FIG. 2a) by the mid and aft buckets 14,12 after the housing 10 is assembled. As best shown in FIG. 4a, each slot 32 forms a projection channel, generally illustrated as 32a, having a projection bottom 32b, a pair of projection sides 32c—32c secured to the projection bottom 32b, and a rear projection wall 32d secured to the projection bottom 32b and to the pair of projection sides 32c—32c. The projection channel 32a includes an open projection front 32e.

The guide rails 34 are preferably molded into and are part of the inner side 40 of the aft bucket 12. A bracket wall 38 is also formed into the inner side 40 and is secured perpendicularly to the inner side 40 of the aft bucket 12. The bracket wall 38 is secured to each of the guide rails 34 in order to provide added support to the receptacles 30 and their components.

A cross-brace 41 is positioned between the guide rails 34 to provide additional support for the guide rails 34 and enable the guide rails 34 to withstand applied forces in opposing vertical directions 36. In the illustrated embodiment, the cross-braces 41 are positioned at a slight angle relative to the inner side 40 of the aft bucket 12, which provide further support to the guide rails 34.

Also in accordance with the invention, air ducts 42 are formed between the guide rails 34 in each of the receptacles 30. The air ducts 42 enable air to flow from outside the housing 10 to inside the housing 10, or vice versa, through the joint 18. Apertures 44 are provided in the bracket wall 38 for each receptacle to enable air to pass from inside the housing 10, through the apertures 44, through air ducts 42, and out the joint 18 (or vice versa). An additional space 81 is formed in the joint 18, which also allows air to flow through the joint 18 from outside to inside the housing 10, or vice versa. Apertures 44 are located in the bracket wall 38 adjacent to the cross-braces 41 and slanted surfaces 56. The guide rails 34 also have a height 35 sized in a lateral direction 60 such that the inner side 40 of the aft bucket 12 is spaced slightly apart from the projections 28 after assembly. The height 35 of the guide rails 34 enables air to pass between the mid and aft buckets 14,12 and through the joint 18, yet prevents casual or accidental attempts to access internal components of the monitor housing 10.

A major snap feature 46 is attached to the mid bucket 14 and is designed to clasp around an edge 48 of the bracket wall 38 to secure the mid bucket 14 to the aft bucket 12. The major snap feature 46 functions to prevent opposing movement of the aft bucket 12 and mid bucket 14 in a horizontal direction 52 after the housing 10 is assembled. A minor snap feature 50, which is smaller in size relative to the major snap feature 46, is also attached to the mid bucket 14 and designed to clasp the post 23 of the lid 11. The minor snap feature 50 also functions to prevent opposing movement of the mid bucket 14 and aft bucket 12 in the horizontal direction 52. The minor snap feature 50 also functions to tightly secure together the outer corners 51 of the joint 18.

It should be noted, that in the preferred embodiment the receptacles 30 and the aft bucket 12 are molded together as a single unit. Similarly, the projections 28 and the mid bucket 14 are also molded together as a single unit. This aspect provides added strength to the housing 10 and facilitates assembly of the housing 10 during production.

Now, referring specifically to the receptacles 30, each receptacle 30 includes a slanted surface 56 which is designed to engage an indentation 58 on the projection 28. During assembly of the housing 10, the slanted surfaces 56 function to facilitate assembly of the housing 10 by guiding the projections 28 into the proper locations, and also function to secure the projections 28 against the side 40 of the aft bucket 12. The slanted surface 56 and indentation 58 function together to prevent opposing lateral movement of the mid and aft bucket 14, 12 in the lateral direction 60 after assembly of the housing 10.

Each projection 28 includes a tubular portion 62 which is configured into the projection 28 to provide added strength to the projection 28. The tubular portion 62 increases the width of the projection 28, thus strengthening the projection 28 while minimizing the added weight and use of additional material. In other embodiments the re-enforced tubular portion 62 may be solid.

A base 64 of the mid bucket 14 includes a tongue 66, and the base 68 of the aft bucket 12 includes a notch 70 sized to receive the tongue 66. A base snap feature 72 is included on the base 68, and is fitted to clasp around and be secured to a base tab 74 on the base 64. The tongue 66 and notch 70 function together to correctly position the mid and aft bucket 14, 12 of the monitor housing 10 during assembly and to provide additional support for the assembled monitor housing 10.

A matrix 76 of support extensions is included on the base 68. The matrix 76 of support extensions surrounds the notch 70 and provides added strength and support to the base 68 of the aft bucket 12. The matrix 76 extends perpendicularly with respect to the base 68.

Referring to FIG. 2b, illustrated are the disassembled mid and aft buckets 14,12 shown in FIG. 2a, but viewed from a different angle. Shown are the inner left side 40 of the aft bucket 12, and the outer left side 17 of the mid bucket 14. The perspective view provided in FIG. 2a is from a slightly more elevated position that the position in FIG. 2a. The guide rails 34, cross-braces 41, and slanted edges 56 may be more easily viewed from the perspective provided in FIG. 2b.

In accordance with a further aspect of the present invention, an edge 80 of the inner left side 40 of the aft bucket 12 is illustrated extending over the receptacles 30. The edge 80 prohibits casual or accidental access to the inner components of the monitor via the joint 18 after the housing 10 is assembled. The edge 80 also strengthens the guide rails 34.

Referring to FIG. 2c, illustrated are the mid and aft bucket 14,12 viewed from a different perspective than shown in FIG. 2b. Shown are the outer left side 59 of the aft bucket 12, and the outer left side 17 of the mid bucket 14. From the perspective view provided in FIG. 2c, the tubular reinforced portions 62 may be viewed more clearly. Similarly, the slanted edges 56 of the receptacles 30 also may be viewed more clearly in FIG. 2c.

Figure 2D:
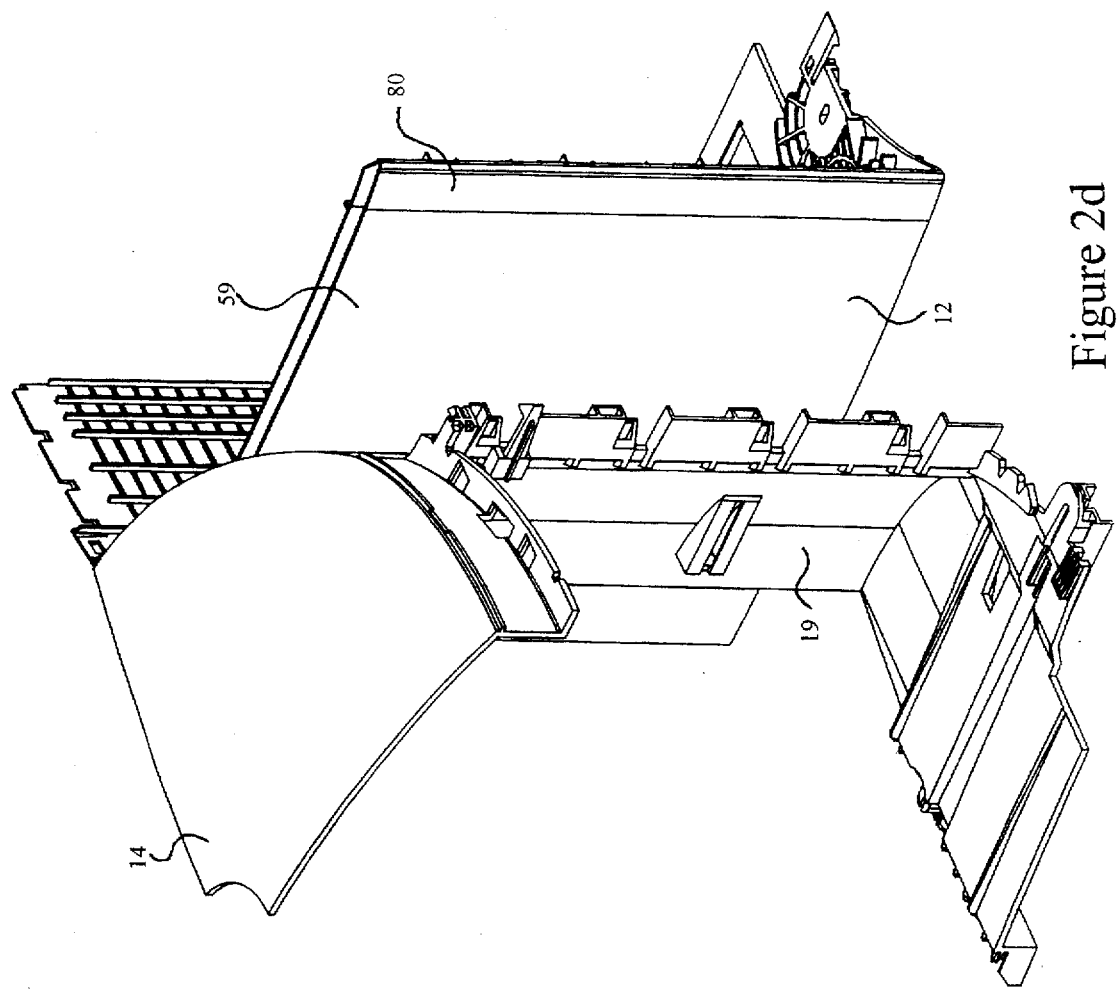
FIG. 2d is another cut-away perspective view of the two sections shown in FIG. 2c, but viewed from a slightly different angle.

Referring to FIG. 2d, illustrated is a view of the mid and aft bucket 14,12 viewed from a different angle than that illustrated in FIG. 2c. Shown are the outer left side 59 of the aft bucket 12, and the inner left side 19 of the mid bucket 14. FIG. 2d clearly illustrates the edge 80 of the outer left side 59 of the aft bucket 12 extending beyond and covering the receptacles 30.

Figure 3:
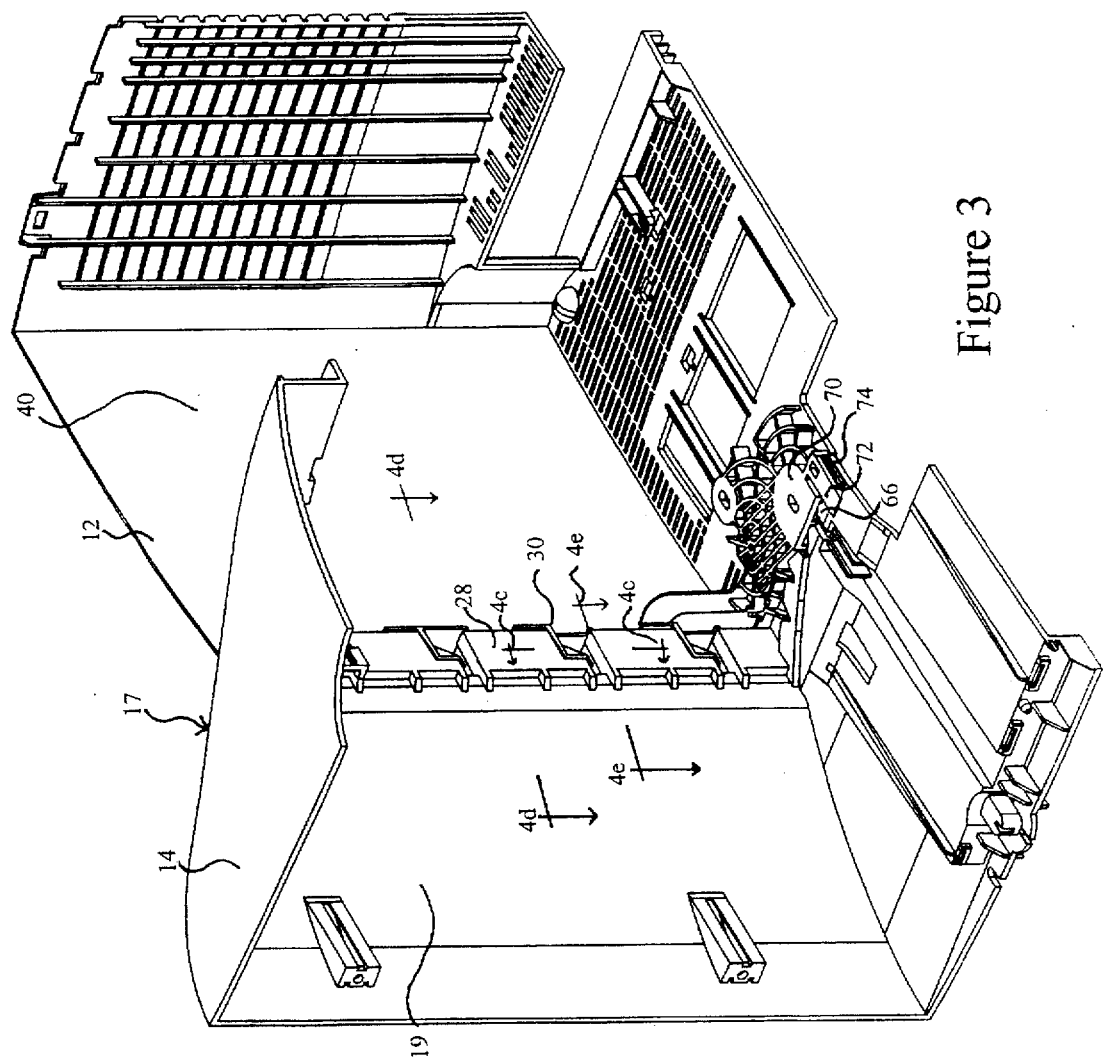
FIG. 3 is a cut-away perspective view of the sections shown in FIGS. 2a–2d after being assembled in accordance with the present invention.

Referring now to FIG. 3, illustrated are the mid and aft buckets 14,12 in a fully assembled position. Shown are the inner left side 40 of the aft bucket 12, and the inner left side 19 of the mid bucket 14. The projections 28 are shown to be positioned in the corresponding receptacles 30 of the aft bucket 12. Also illustrated is the tongue 66 positioned within the notch 70. The base snap feature 72 is shown to be clasped around the base tab 74. As shown in FIG. 3, the mid and aft buckets 14,12 are secured together by the projections 28, receptacles 30, tongue 66, notch 70, and base snap feature 72.

Referring now to FIG. 4a, illustrated is an enlarged view of a projection 28 and a receptacle 30. Illustrated are bracket wall 38, guide rails 34, apertures 44, cross-brace 41, slanted surface 56, slot 32, tubular portion 62, and indentation 58. The edge 80 and inner left side 40, which are illustrated in FIG. 2b, are omitted in FIG. 4a so that the projection 28 and the receptacle 30 can be more clearly illustrated. FIG. 4a corresponds to the left side of the monitor housing 10, looking towards the inside of the monitor housing.

Figure 4B:
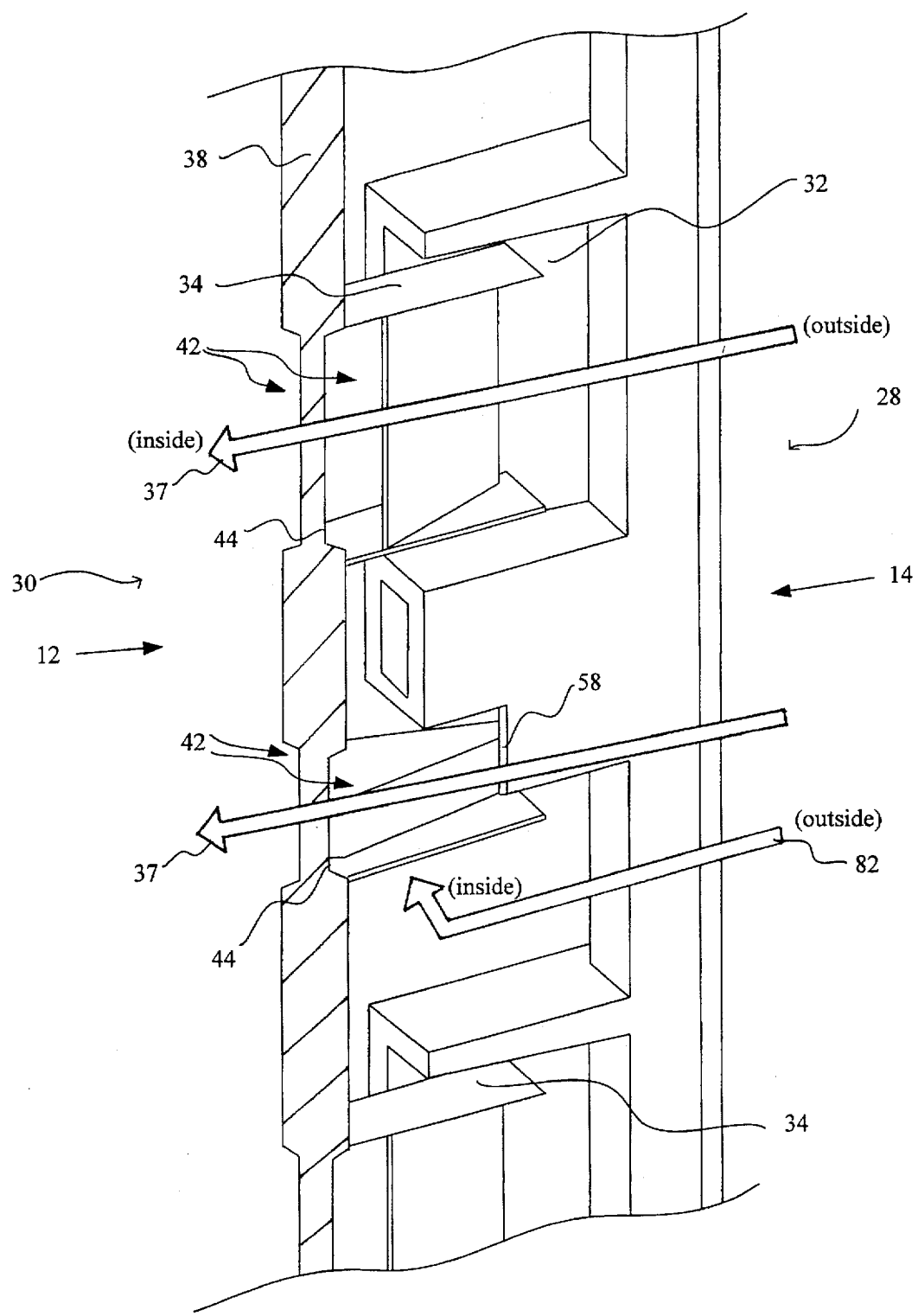
FIG. 4b is an enlarged perspective view of the joint shown in FIG. 4a, wherein the joint is assembled.

Referring to FIG. 4b, illustrated are the projection 28 and the receptacle 30, shown in FIG. 4a, in an assembled position. The guide rails 34 are positioned within the slot 32 and adjacent to the indentation 58. As in FIG. 4a, the edge 80 and inner left side 40, and the aft bucket 12 panel of which side 40 is a surface, are omitted. Bucket 12 is cut away along a plane parallel to and inside surface 40, passing just inside apertures 44 and through guide rails 34. Thus, receptacles 30 appear as they would be seen from the outside of aft bucket 12 if the side 40 panel were transparent. In accordance with the invention, air ducts 42 enable air 37 to flow through the apertures 44, between the guide rails 34, behind the projection 28, and through the entire joint 18.

Arrow 37 illustrates the flow of air traveling from outside to inside the monitor housing 10. Arrow 37 also identifies the air flow path corresponding to air duct 42 shown in FIG. 2a which passes adjacent to the slanted surface 41. Arrow 82 also illustrates the flow of air traveling from outside to inside the monitor housing 10 along a slightly different air path from that identified by arrow 37. Arrow 82 corresponds to the air flow path passing through space 81 in FIG. 2a. As illustrated, the air path shown by air 82 makes a sharp turn and passes between the projections 28 and the receptacles 30, and towards the inside of the monitor housing 10.

Figure 4C:
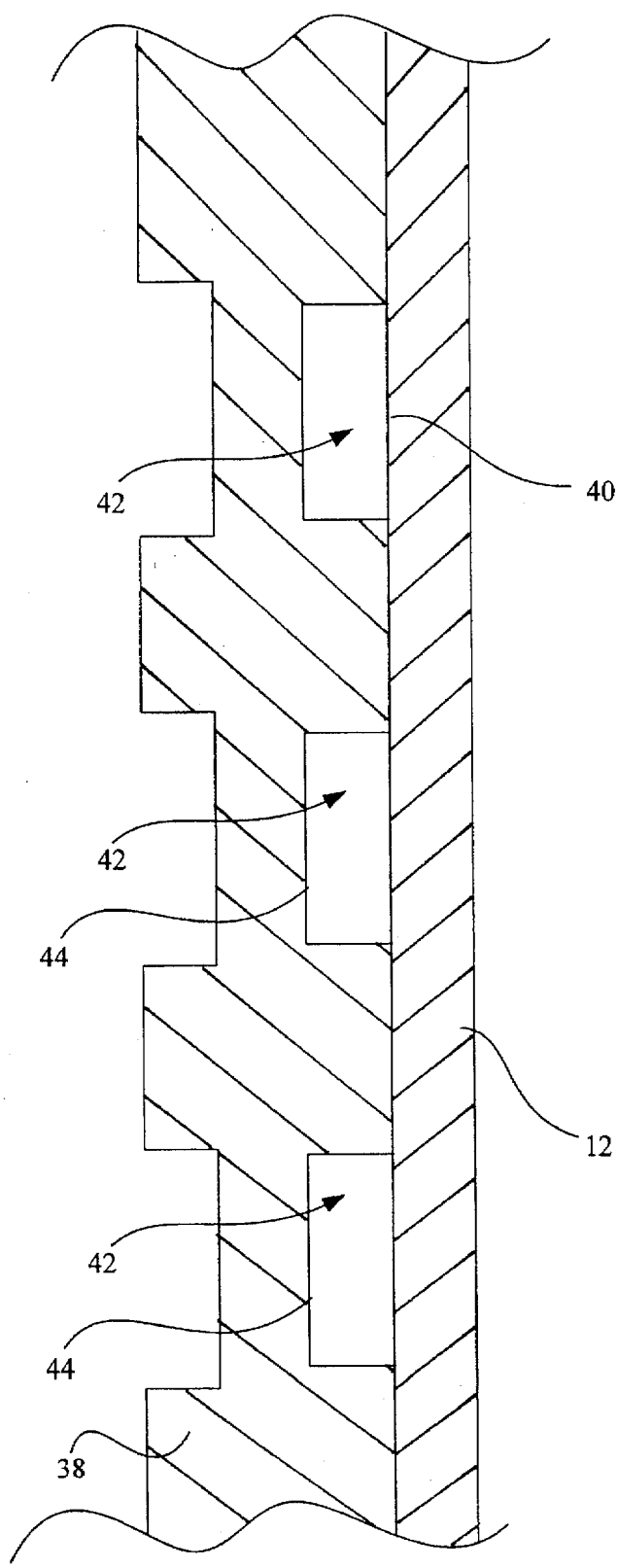
FIG. 4c is a cross-sectional view of the joint shown in and taken along line 4c—4c in FIG. 3.

Referring FIG. 4c, illustrated is a cross-sectional view of the joint 18 shown in and taken along the line 4c—4c in FIG. 3. Shown are the inner side wall 40 of the aft bucket 12 and the apertures 44 in the bracket wall 38. This view provides an additional view of the air ducts 42, as viewed looking at the apertures 44 of the bracket wall 38 towards the mid bucket 14.

Figure 4E:
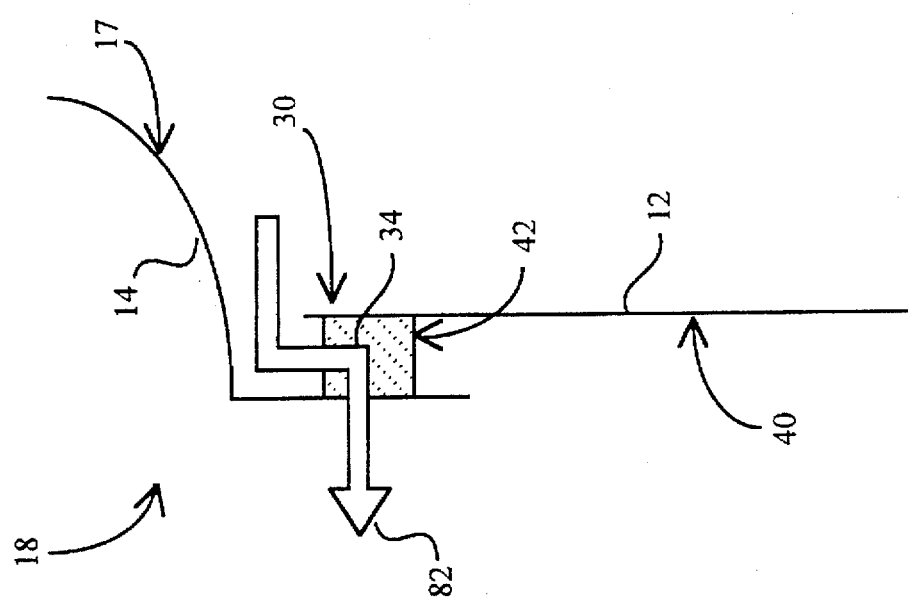
FIG. 4e is a cross-sectional view of the joint shown in and taken along line 4e—4e in FIG. 3.
Figure 4D:
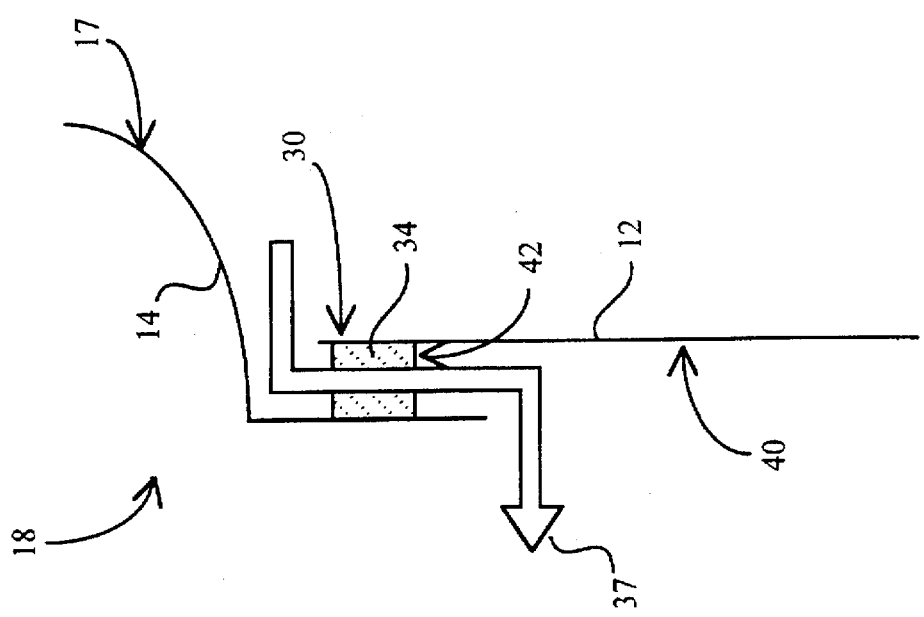
FIG. 4d is a cross-sectional view of the joint shown in and taken along line 4d—4d in FIG. 3.

Referring to FIG. 4d, illustrated is a cross-sectional view of the joint 18 shown in and taken along the line 4d—4d in FIG. 3. Shown are the outer left side 17 of the mid bucket 14, guide rails 34, the joint 18, and the inner left side 40 of the aft bucket 12. Air flow arrow 37 is shown passing through the air duct 42 formed between the guide rails 34 of the joint 18.

Referring to FIG. 4e, illustrated is a cross-sectional view of the joint 18 shown in and taken along the line 4e—4e in FIG. 3. Shown are the outer left side 17 of the mid bucket 14, guide rails 34, the joint 18, and the inner left side 40 of the aft bucket 12. Air flow arrow 82 is shown passing through the space 81 of the joint 18.

As set forth in the above discussion, the present invention provides a multipiece housing 10 for a monitor having a mid bucket 14 as a first section with a plurality of projections 28 and an aft bucket 12 as a second section. The aft bucket 12 has a row of receptacles 30 for receiving a row of the projections 28 on the mid bucket 14 during the assembly of the housing 10. Each receptacle 30 includes an air duct 42 enabling air to flow bidirectionally between outside the housing 10 and inside the housing 10 after being assembled. Separate sections of the multipiece housing 10 are completely assembled by hand and without using any special tools. Each receptacle 30 includes a pair of parallel guide rails 34 and a slanted surface 56 that guide each receptacle 30 into a slot 32 in the corresponding projection 28. Joint 18 formed between the separate sections, while providing air vents, prohibits causal and accidental access to the internal components of the monitor. Snap features are included on one of the sections to assist in securing together the first and second sections during assembly of the housing 10.

The invention has now been explained with reference to specific embodiments. Other embodiments will be apparent to those of ordinary skill in the art in light of this disclosure. Therefore, it is not intended that this invention be limited, except as indicated by the appended claims.

I claim as my invention:

1. A multipiece housing for a monitor, comprising:
    a first section having a plurality of projections; and
    a second section having a plurality of receptacles for receiving the plurality of projections during assembly of the housing, at least one of the receptacles including an inner side, a pair of guide rails secured to the inner side, and a cross-brace connected to the guide rails and angled with respect to the inner side which form an air duct enabling air to flow bidirectionally between the inside and the outside of the assembled housing.

2. The multipiece housing as defined in claim 1, wherein the plurality of projections of the first section and the plurality of receptacles of the second section are aligned.

3. The multipiece housing as defined in claim 1, wherein:
    each receptacle includes a pair of parallel guide rails; and
    each projection includes a slot fitted to receive a pair of parallel guide rails during assembly, so as to prevent opposing vertical movement between the first and second sections.

4. The multipiece housing as defined in claim 1, further comprising:
    a snap feature on the first section; and
    an edge on the second section to be clasped by the snap feature during assembly of the housing, and the snap feature preventing opposing horizontal movement between the first and second sections.

5. The multipiece housing as defined in claim 1, further comprising:
    a slanted surface within a receptacle of the second section; and
    an indentation in a projection of the first section that abuts the slanted surface during assembly of the housing, and the slanted surface functions to facilitate assembly of the housing by sliding the projection of the first section into place and preventing lateral opposing movement between the first and second sections.

6. The multipiece housing as defined in claim 3, further comprising:
a bracket wall secured perpendicularly to an inner surface of the second section of the housing and also secured to the guide rails, the bracket wall functioning to provide added support to the guide rails.

7. The multipiece housing as defined in claim 1, further comprising:
a tongue secured to the first section; and
a notch in the second section fitted to receive the tongue during assembly of the housing.

8. The multipiece housing as defined in claim 7, wherein the tongue and notch are located in a base of the housing.

9. The multipiece housing as defined in claim 8, further comprising:
a matrix of support extensions on the base of the second section and surrounding the notch.

10. The multipiece housing as defined in claim 1 additionally comprising a bracket wall secured to said guide rails, and a slanted surface secured to the bracket wall.

11. The multipiece housing as defined in claim 1 wherein said projections define a projection channel including a projection bottom, a pair of projection sides secured to said projection bottom, and a rear projection wall secured to said projection bottom and to said pair of projection sides.

12. The multipurpose housing as defined in claim 11 wherein each said projection channel includes an open projection channel front.

13. A multipiece housing for a monitor, comprising:
a first section having a plurality of projections each configured with a tubular portion which increases the width and strength of the respective projection; and
a second section having a plurality of receptacles for receiving the plurality of projections during assembly of the housing, at least one of the receptacles including an air duct enabling air to flow bidirectionally between inside the housing and outside the housing after being assembled.

14. A multipiece housing for a monitor, comprising:
a first section having a plurality of projections; and
a second section having a plurality of receptacles for receiving the plurality of projections during assembly of the housing, at least one of the receptacles including an air duct enabling air to flow bidirectionally between inside the housing and outside the housing after being assembled;
each receptacle including a pair of parallel guide rails, and each projection including a slot sized to receive a pair of parallel guide rails during assembly of the housing, to prevent opposing vertical movement between the first and second sections; said guide rails being sized to space a side of the first section far enough from the receptacles to allow air to pass through the air duct and between the first and second sections, yet prevent casual attempts to access internal components of the housing.

15. The multipiece housing as defined in claim 14, wherein a side of the second section extends beyond the receptacles so as to cover the receptacles and prevent casual attempts to access internal components of the multipiece housing via the air ducts after assembly.

16. The multipiece housing as defined in claim 6, wherein the bracket wall includes apertures between the guide rails, and the guide rails and apertures function as air ducts via a joint formed between the first and second sections.

17. A multipiece housing for a monitor, comprising:
a first section having a plurality of projections each including a slot defined by a projection channel including a projection bottom, a pair of projection sides secured to said projection bottom, and a rear projection wall secured to said projection bottom and to said pair of projection sides;
a second section having a plurality of receptacles for receiving the plurality of projections during assembly of the housing; and
a snap feature attached to the first section and sized to clasp an edge of the second section, which secures the first and second sections together by holding the projections within the receptacles after assembly of the multipiece housing.

18. The multipiece housing as defined in claim 17, further comprising:
each receptacle includes a pair of parallel guide rails; and
each projection includes said slot fitted to receive a pair of parallel guide rails during assembly, so as to prevent opposing vertical movement between the first and section sections.

19. The multipiece housing as defined in claim 18, wherein the guide rails space apart the first and second sections after assembly so as to form an air duct.

20. The multipiece housing as defined in claim 18, further comprising:
a cross-brace secured to and between each of the guide rails and forms part of the air duct, and the cross-braces function to provide additional vertical support to the guide rails.

21. The multipiece housing as defined in claim 20, wherein the air duct formed by the cross-brace and the guide rails is recessed behind a side of the second section and runs parallel to the side of the second section, thereby prohibiting causal and accidental access to internal components of the multipiece housing after assembly.

22. A multipiece housing for a monitor, comprising:
a first section having a plurality of projections; each including a projection channel including a projection bottom, a pair of projection sides secured to said projection bottom, and a rear projection wall secured to said projection bottom and to said pair of projection sides; and
a second section having a plurality of receptacles for receiving the plurality of projections during assembly of the housing, at least one of the receptacles including an air duct enabling air to flow bidirectionally between the inside and the outside of the housing after being assembled.

* * * * *